United States Patent [19]
Scott et al.

[11] Patent Number: 6,141,259
[45] Date of Patent: Oct. 31, 2000

[54] DYNAMIC RANDOM ACCESS MEMORY HAVING REDUCED ARRAY VOLTAGE

[75] Inventors: David B. Scott, Plano; Donald J. Coleman, deceased, late of Plano, both of Tex., by Linda S. Coleman, executrix

[73] Assignee: Texas Instruments Incorporated, Dallas, Tex.

[21] Appl. No.: 09/252,409

[22] Filed: Feb. 18, 1999

Related U.S. Application Data

[60] Provisional application No. 60/075,052, Feb. 18, 1998.

[51] Int. Cl.[7] ........................................ G11C 7/00
[52] U.S. Cl. ...................... 365/189.06; 365/205; 365/149
[58] Field of Search ............................... 365/189.06, 205, 365/149

[56] References Cited

U.S. PATENT DOCUMENTS

| | | | |
|---|---|---|---|
| 5,459,345 | 10/1995 | Okudaira et al. | 257/310 |
| 5,581,436 | 12/1996 | Summerfelt et al. | 438/240 |
| 5,856,939 | 1/1999 | Seyyedy | 365/149 |
| 5,972,722 | 10/1999 | Visokay et al. | 438/3 |

*Primary Examiner*—Huan Hoang
*Attorney, Agent, or Firm*—Robby T. Holland; Wade James Brady, III; Frederick J. Telecky, Jr.

[57] ABSTRACT

A random access memory (RAM) having a bipolar reduction in array operating voltage is disclosed. In a preferred embodiment, a clamping transfer gate circuit (414) couple pairs of bit lines (BL and /BL) to pairs of sense nodes (410 and 412). The clamping transfer gate circuit (414) includes an n-channel MOS transistor (N401 and N402) in series with a p-channel MOS transistor (P401 and P402) coupling a bit line (BL or /BL) to a sense node (410 or 412). The gates of the n-channel transistors (N401 and N402) are driven by the high power supply voltage (VDD), and the gates of the p-channel transistors (P401 and P402) are driven by the low power supply voltage (VSS). A sense amplifier circuit (418) drives the sense node pair (410 and 412) to opposite power supply voltages (VDD and VSS). The n-channel transistors (N401 and N402) in the clamping transfer gate circuit (414) clamp the voltage on the bit lines (BL and /BL) to a maximum level of VDD−Vtn, where Vtn is the n-channel transistor threshold voltage. The p-channel transistors (P401 and P402) in the clamping transfer gate circuit (414) clamp the voltage on the bit lines (BL and /BL) to a minimum level of VSS+Vtp, where Vtp is the p-channel transistor threshold voltage. For dynamic RAM applications, memory cells having a higher charge storage capability are disclosed to compensate for the lower array voltages used during refresh operations.

34 Claims, 4 Drawing Sheets

DYNAMIC RANDOM ACCESS MEMORY HAVING REDUCED ARRAY VOLTAGE

This application claims priority under 35 USC §119(e)(1) of provisional application No. 60/075,052 filed Feb. 18, 1998.

TECHNICAL FIELD

The present invention relates generally to semiconductor memory devices, and more particularly to dynamic random access memory devices.

BACKGROUND OF THE INVENTION

An important aspect of semiconductor integrated circuit (IC) performance is power consumption. The use of low power semiconductor ICs can allow battery powered electronic products to operate for longer periods of time, and/or allow the use of smaller batteries or smaller power supplies. Smaller batteries and power supplies can reduce the size, bulk and weight of electronic products.

A common semiconductor IC is the random access memory (RAM). RAMs store information for use by other circuits. The information can be stored within the RAM by a write operation, and the retrieved by a read operation. RAMs can be used in numerous electronic devices, in a standalone form (a RAM "chip"), in which the storing of information is the primary function of the device, or as one portion of a device having a larger function (often referred to as an "embedded" memory).

One of the primary sources of power consumption in many RAM devices is the sense operation within the RAM, and to a lesser extent, an operation referred to as bit line equalization. In order to understand sensing and bit line equalization, the operation of a prior art dynamic RAM (DRAM) will be described.

Figure 1:
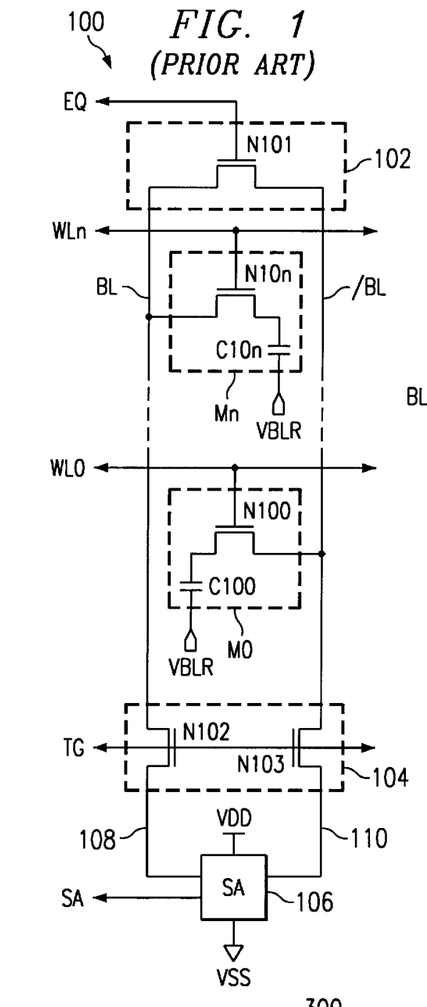
FIG. 1 is a schematic diagram illustrating a prior art DRAM architecture.
Figure 2:
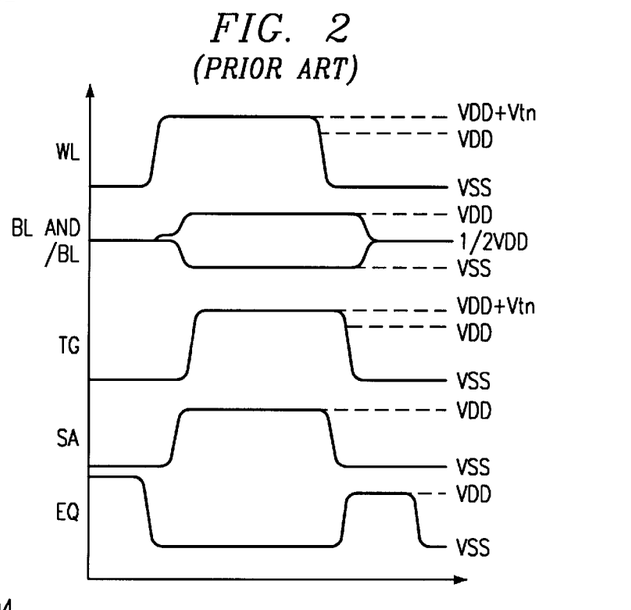
FIG. 2 is a timing diagram illustrating the operation of the DRAM architecture set forth in FIG. 1.

FIGS. 1 and 2 illustrate a DRAM read and refresh operation according to the prior art. In the read operation described, one bit of information is retrieved from the IC. Because the example set forth is that of a DRAM, the read operation is also a refresh operation. DRAMs require a refresh operation because the information stored within will "fade" over time unless it is periodically renewed.

Referring now to FIG. 1, a schematic diagram illustrating a DRAM architecture is set forth. The DRAM architecture is designated by the general reference character 100 and shown to include memory cells M0 and Mn. It is understood that a DRAM device could include literally millions of such memory cells, arranged in one or more arrays. The memory cells (M0 and Mn) are of conventional DRAM design, and include an n-channel "pass" transistor (N100 and N10n) and a storage capacitor (C100 and C10n). The storage capacitors (C100 and C10n) are the elements that actually store information. The amount of charge within a storage capacitor determines the information stored by the memory cell.

Each of the memory cells is coupled to a corresponding word line and bit line. For example, memory cell M0 is coupled to bit line /BL and word line WL0. Similarly, memory cell Mn is coupled to bit line BL and word line WLn. The bit lines BL and /BL form a bit line pair. Toward the top of FIG. 1, a bit line equalization circuit 102 is shown coupled to the bit line pair (BL and /BL). The bit line equalization circuit 102 includes an n-channel transistor N101, that is activated by a signal shown as EQ. Toward the bottom of the FIG. 1, a transfer gate circuit 104 is coupled to the bit line pair (BL and /BL). The transfer gate circuit 104 includes n-channel transistors N102 and N103 which are commonly activated by a signal shown as TG. The transfer gate circuit 104 connects the bit line pair (BL and /BL) to a sense amplifier 106. The sense amplifier 106 receives bit line voltages on first and second sense amplifier nodes (108 and 110).

The operation of the DRAM architecture 100 is best understood in conjunction with FIG. 2, which is a timing diagram illustrating the various control signals and voltage levels of the DRAM architecture 100 of FIG. 1. Prior to the initiation of a read cycle, the bit lines BL and /BL are "equalized" at a voltage that is between the positive power supply voltage, VDD, and the low power supply voltage, VSS. This voltage is shown as ½VDD. The read cycle illustrated by FIG. 2 begins with WL0 rising to a high voltage level. With word line WL0 high, pass transistor N100 within memory cell M0 is turned on, coupling capacitor C100 to bit line /BL. In the example of FIG. 2, it is assumed that capacitor C100 is charged (i.e., stores a positive charge), and so bit line /BL rises in potential, diverging in potential from bit line BL.

As the potential of the two bit lines (BL and /BL) diverge, the TG signal goes high, coupling the bit line pair (BL and /BL) to the sense amplifier circuit 106. The SA signal then goes high, activating the sense amplifier circuit 106 which drives the bit lines (BL and /BL) to opposite voltage according to the differential voltage on the bit line pair (BL and /BL). This is the operation that can consume considerable power. Because bit line /BL was higher than bit line BL, the bit line /BL is driven to the high power supply voltage (VDD) and the bit line BL is driven to the lower power supply voltage (VSS). Because the word line WL0 is still high, the VDD voltage on bit line /BL recharges (refreshes) storage capacitor C100. At the same time, the amplified voltage output from the sense amplifier circuit 106 can be output to other amplifiers, and eventually, an input/output (I/O) pin on the memory device. It is desirable to have the sense amplifier 106 drive the sense amplifier nodes (108 and 110) between the supply voltage levels (VDD and VSS), to provide the fastest driving capability, and thus the fastest sensing and refresh speeds.

After the capacitor C100 has been recharged, word line WL0 falls low to the voltage VSS. This turns off transistor N100, isolating capacitor C100 from the bit line, and trapping the charge stored therein.

The bit line equalization operation occurs once the sensing operation is complete (i.e., the bit lines have been driven to opposite supply voltage levels). In FIG. 1, the equalization function is performed by the equalization circuit 102. After the word line WL0 falls, the EQ signal pulses high. With the EQ signal high, transistors N101 is turned on. This action shorts the two bit lines (BL and /BL) together, and precharges the bit lines to the ½VDD voltage. It is understood that the sense amplifier circuit 106 also equalizes the sense amplifier nodes 108 and 110 to a ½VDD voltage level.

Thus, in the bit line equalization operation, bit line pairs charged at opposite supply voltage levels are shorted together, and at the same time, precharged to the ½VDD voltage. Because hundreds or even thousands of such bit line pairs are equalized at the same time, the equalization operation consumes considerable power. Further, because memory devices increase in size with each generation (i.e., 64 megabit (Mb) to 256 Mb and up), each new generation of memory devices can have more bit line pairs, and/or longer bit line pairs, than each previous generation.

Fortunately, at the same time bit line pairs and/or sizes have been increasing, transistor channel lengths have been decreasing, allowing for the use of lower power supply voltages. With lower power supply voltages, the bit lines pairs do not have to be driven to as high a voltage, resulting in less power consumption during the bit line equalization operation. There is a limit to the amount by which power supply voltages can be reduced. If power supplies are too low, the sense amplifiers will not be able to drive the bit lines fast enough, or to a high enough voltage level, to refresh memory cells in a sufficient amount of time.

In addition to high power consumption, conventional DRAMs having arrays which operate at supply voltage levels have other requirements that add to the complexity of the DRAM design. Referring back to FIG. 2, it is noted that when the word line WL0 and the TG signal initially go high, both signals exceed the high power supply VDD by an additional amount, designated as Vtn. This operation is often referred to as "booting." Booting is used to overcome the threshold voltage drop that would be introduced by n-channel transistors. Booted word lines provide a lower resistance path between the storage capacitors (C10n and C100) and their associated bit lines (BL and /BL), and during the refresh operation, allow the full level VDD signal to be coupled to the storage capacitor. Booted TG signals provide the same results with respect to the transfer gate circuit 104 devices.

A drawback to the use of booted signals is the additional circuitry that is required to provide a higher-than-supply signal. Booting could be eliminated by using a complementary metal-oxide-semiconductor (CMOS) transfer gate (a p-channel transistor and n-channel transistor in parallel, activated by complementary clock signals). Because the CMOS transfer gate has a p-channel device, no threshold drop would be introduced. While CMOS transfer gates could be used in the transfer gate circuit 104, such an implementation would increase the size of the transfer gate circuit 104. This same drawback makes CMOS transfer gates extremely impractical as substitutes for pass transistors in memory cells (as replacements for N10n and N100). The additional p-channel transistor for each memory cell in a semiconductor device having millions of such cells, would result in a large increase (as much as 33%) in the device size.

In addition to word line and transfer gate control signal "booting", there are other aspects of conventional DRAM design which should be taken into account when modifying a DRAM beyond conventional design approaches. The first is substrate biasing. In many conventional DRAM approaches, the substrate in which the DRAM is formed, is biased below the low power supply voltage. For example, if the lower power supply VSS were zero volts, the substrate would be "back-biased" at a negative voltage, VBB. The advantages provided by the substrate back-bias are best understood with reference to FIG. 3.

Figure 3:
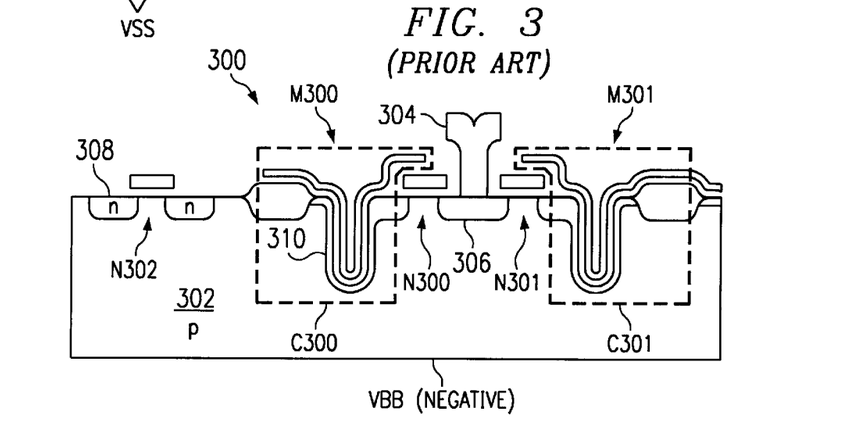
FIG. 3 is a side cross sectional view of a DRAM according to the prior art.

FIG. 3 is a side cross sectional view of a DRAM device 300 having a substrate 302 in which memory cells M300 and M301 are formed. The memory cells (M300 and M301) each include a pass transistor (N300 or N301) and a storage capacitor (C300 and C301). The memory cells are coupled to a bit line 304. The bit line 304 is coupled to the substrate 302 at a common n-type drain diffusion 306. A back-bias voltage advantageously increases the bias voltage across the common drain diffusion 306, more so than if the substrate was only at zero volts. The increase in bias voltage reduces the capacitance of the p-n junction formed by the diffusion 306, allowing the charge transferred from the storage capacitor to cause a larger voltage change on the bit line 304.

A second advantage of maintaining the substrate 302 at a back-bias voltage is reducing the likelihood of minority carrier injection from a storage capacitor to the substrate. The storage node of storage capacitor C300 310 is shown to be an n-type region within the substrate 302. For the purposes of this discussion, it is assumed that the storage capacitor C300 is storing a logic "0" (i.e., is discharged to VSS) and that the substrate is biased the VSS. In the event the substrate 302 rises above VSS (a condition referred to as substrate "bounce"), the p-n junction created by the n-type region of the storage node 310 can forward bias. Electrons (the minority carriers in this case) can be injected into the substrate 302. The charge on the storage capacitor C300 is thus altered, and can result in a data error when memory cell M300 is read. The substrate bounce condition can arise due to the inductance of conductors carrying the VSS supply to the substrate. If the substrate 302 were back biased, the substrate 302 would have to rise to a much higher potential in order to forward bias the storage node 310. Negative biasing of the substrate also increases the threshold voltage of pass transistors and thick field devices, which improves data integrity.

Yet another aspect of DRAM design that should be considered is the leakage introduced by the pass transistors (such as N10n and N100 of FIG. 1). In order to reduce any leakage from the charge stored on storage capacitors (such as C10n and C100) through the pass transistors, the threshold voltage of the pass transistors may be increased above the other n-channel transistors in the DRAM. As a result, when the pass transistors are turned off by the application of the low supply voltage (VSS) to their respective gates, leakage is reduced above and beyond the conventional n-channel transistors.

Reductions in DRAM power consumption could also be achieved by using a lower voltage in the array than in the other portions of the device. One way of providing the lower array voltage would be to use a non-booted TG signal. With a non-booted TG signal, when the sense amplifier is activated, one bit line would still be driven to the low VSS supply voltage, but the other bit line would be driven to a level of VDD−Vtn (where Vtn is the n-channel threshold voltage).

While reducing power consumption, such a reduction in array voltage can increase the common mode activity of the sense amplifier. With one bit line driven to the VSS voltage and the other driven to a VDD−Vtn voltage level, the bit lines will equalize to a voltage level of ½(VDD−Vtn). In contrast, the sense amplifiers typically equalize the sense amplifier nodes to the ½VDD voltage level. As a result, when the sense amplifiers are activated, the voltage at the sense amplifier nodes would include not only the differential voltage created by a memory cell coupled to the bit line pair, but also a common mode signal created by the difference in the different precharge voltages of the sense amplifier nodes and bit line pairs. This could lead to erroneous or slower sensing, or require more complex sense amplifier designs.

Thus, while unbooted transfer gates can be employed to reduce power consumption in a RAM device, such an approach has sensing drawbacks. It would be desirable to arrive at some way of reducing the power consumption of a RAM device, while at the same time, taking into account the various aspects of conventional RAM design, particularly DRAM design, discussed above.

SUMMARY OF THE INVENTION

According to a preferred embodiment of the present invention, a random access memory device has a bipolar reduction in the operating voltage of the memory cell array.

The memory cells of the array are coupled to bit line pairs. The bit line pairs are coupled to sense nodes of sense amplifiers by clamping transfer gate circuits. The clamping transfer gate circuits produce the bipolar reduction in array voltage, and include an n-channel MOS transistor arranged in series with a p-channel MOS transistor. The sense amplifiers drive their respective sense nodes to opposite power supply voltages (VDD and VSS). The transistors of the clamping transfer gate circuits limit the maximum bit line voltage to VDD−Vtn, and the minimum bit line voltage to VSS+Vtp. The voltage Vtn is the threshold voltage of the n-channel transistors, and the voltage Vtp is the threshold voltage of the p-channel transistors. By operating the bit lines at lower voltages, the sensing operation consumes less power.

According to one aspect of the preferred embodiment, the RAM device is a DRAM having memory cells with storage capacitors. To account for the reduction in the maximum and minimum bit line voltages, the dielectric of the storage capacitors can be modified to have higher charge storage characteristics.

According to another aspect of the preferred embodiment, the gate of one of the transistors in the voltage regulating transfer gate structures can be tied to a supply voltage, to maintain the transistor in the "on" condition.

An advantage of the preferred embodiment is that by reducing the array high voltage (to VDD−Vtn), while at the same time increasing the array low voltage (to VSS+Vtp), the bit lines can equalize at a voltage that is generally half of the supply voltage ½VDD. Such a bit line precharge voltage level reduces the common mode signal coupled to the sense amplifiers.

Another advantage of the preferred embodiment is that the bipolar reduction in the array voltage allows transistors in the array to be placed in a very low leakage state when turned off. For example, in a DRAM, the n-channel MOS pass transistors of memory cells could be turned off using the low power supply VSS, which is lower than the lowest voltage used in the array. As a result, pass transistors could be manufactured without a threshold adjustment step, and still provide low leakage operating characteristics.

Another advantage of the preferred embodiment is that by utilizing a low array voltage that is greater than the low supply voltage, a DRAM could be fabricated having some of the benefits of back-biasing, without having to include a back-bias circuit.

Another advantage of the present invention is that by utilizing a high array voltage that is less than the high power supply voltage, a DRAM could be fabricated having the benefits of booted word lines and column pass gate transistors, without implementing booting circuits.

DETAILED DESCRIPTION OF THE EMBODIMENTS

The preferred embodiment is a DRAM architecture that drives bit lines to voltages less than the supply voltages, resulting in less power consumption during sensing operations. The preferred embodiment will be described with reference to one pair of bit lines, but it is understood that the bit line pair illustrated is repeated numerous times in a DRAM device. Additional advantages of the preferred invention, above and beyond the considerable power savings, will be described below in conjunction with the description of the operation of the preferred embodiment.

Figure 4:
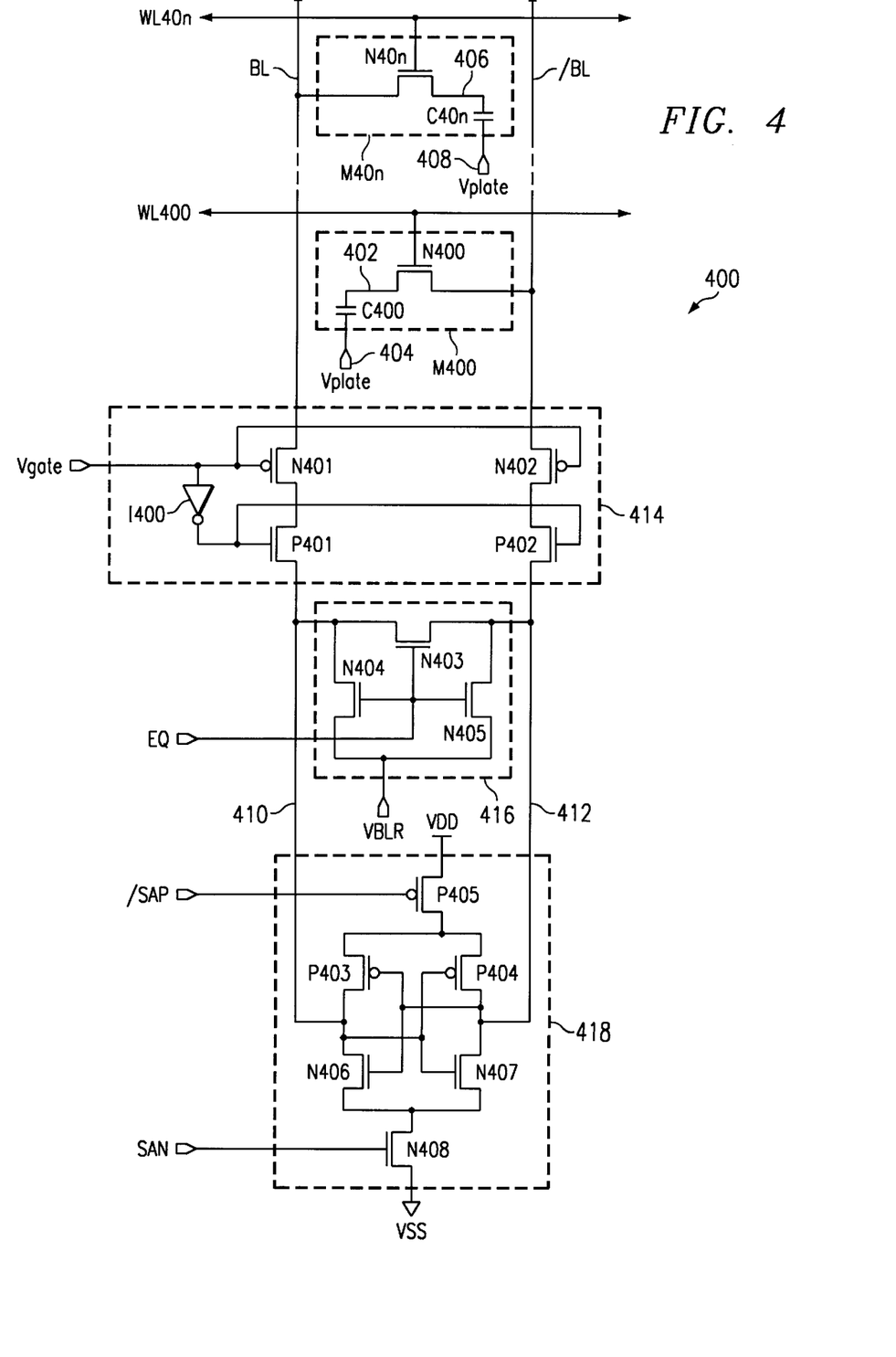
FIG. 4 is a schematic diagram of a preferred embodiment DRAM architecture.

Referring now to FIG. 4, the preferred embodiment is set forth in a schematic diagram and designated by the general reference character 400. The preferred embodiment 400 includes a bit line pair BL and /BL. Two memory cells, M400 and M40n, are illustrated in FIG. 4. Memory cell M400 is coupled to bit line /BL, and a memory cell M40n is coupled to bit line BL. Memory cell M400 includes an n-channel MOS transistor N400 and a storage capacitor C400. The storage capacitor includes a storage node 402 and a counter node 404. The memory cell M40n has a similar arrangement to memory cell M400, and includes a pass transistor N40n and storage capacitor C40n. The storage capacitor includes a storage node 406 and a counter node 408.

An even word line WL400 is shown coupled to memory cell M400 at the gate of transistor N400. An odd word line WL40n is shown coupled to memory cell M40n at the gate of transistor N40n. The preferred embodiment 400 represents one column of memory cells in an array. Memory cell M400 can be considered to representative of the memory cells in the even rows along a given column. The memory cells in the even rows will be coupled to the bit line /BL by an even word line (such as WL400). It follows that memory cell M40n can be considered representative of the memory cells in odd rows along the column, with the memory cells in odd rows being coupled to the bit line BL by an odd word line (such as WL40n).

Referring once again to FIG. 4 it is shown that the counter nodes (404 and 408) of the storage capacitors (C400 and C40n) are commonly coupled to a potential Vplate. In the preferred embodiment, the Vplate potential is half-way between the supply voltages, VDD and VSS. Because VSS is zero volts, Vplate =½VDD. A data value of "1" is stored within a cell by charging the storage node of the cell (402 or 406) above the Vplate voltage, to VDD−Vtn. A data value of "0" is stored within a cell by discharging the storage node of the cell (402 or 406) below the Vplate voltage, to VSS+Vtp.

The bit line pair (BL and /BL) is coupled to a pair of sense nodes (410 and 412) by a clamping transfer gate circuit 414. The clamping transfer gate circuit 414 provides a clamped conductive path between each bit line (BL and /BL) and one of the sense nodes (410 and 412). A first series arrangement of an n-channel MOS transistor N401 and a p-channel MOS transistor P401 couples bit line BL to sense node 410. A second series arrangement of an n-channel MOS transistor N402 and a p-channel transistor P402 couples bit line /BL to sense node 412. The gates of transistors N401 and N402 receive a control signal Vgate. The same Vgate signal is inverted by inverter I400 and coupled to the gates of transistors P401 and P402.

An equalization circuit 416 is disposed between the sense nodes (410 and 412). The equalization circuit 416 is activated by the EQ signal, and is shown to include an n-channel MOS shorting transistor N403 having a source-drain path coupled between the sense nodes (410 and 412). In addition, two precharge n-channel MOS transistors are provided (N404 and N405). Transistor N404 has a source-drain path coupled between the sense node 410 and a precharge voltage node VBLR. In a similar manner, transistor N405 has a source-drain path coupled between the sense node 412 and the precharge voltage node VBLR. The gates of transistors N403–N405 are commonly driven by the signal EQ.

A sense amplifier circuit 418 is also disposed between the sense nodes (410 and 412). The sense amplifier circuit 418 is a CMOS sense amplifier that includes a pair of cross-coupled CMOS drivers. The first CMOS driver is formed by p-channel MOS transistor P403 and n-channel MOS transistor N406. The second CMOS driver is formed by p-channel MOS transistor P404 and n-channel MOS transistor N407. The output (the common drains) of transistors P403 and N406 are coupled to the common gates of transistors P404 and N407. In a complementary fashion, the output of transistors P404 and N407 is coupled to the common gates of transistors P403 and N406.

The pair of CMOS drivers in the sense amplifier circuit 418 is activated by a pull-up p-channel MOS transistor P405, and a pull-down n-channel MOS transistor N408. Transistor P405 has a source-drain path coupling the sources of p-channel transistors P403 and P404 to the high power supply VDD. The gate of transistor P405 is activated by a sense amplifier enable signal /SAP. Transistor N408 has a source-drain path coupled between the sources of transistors N406 and N407 and the low power supply voltage VSS. The gate of transistor N408 is driven by the sense amplifier enable signal SAN. In the preferred embodiment, the signal SAN is the inverse of the signal SAP.

Figure 5:
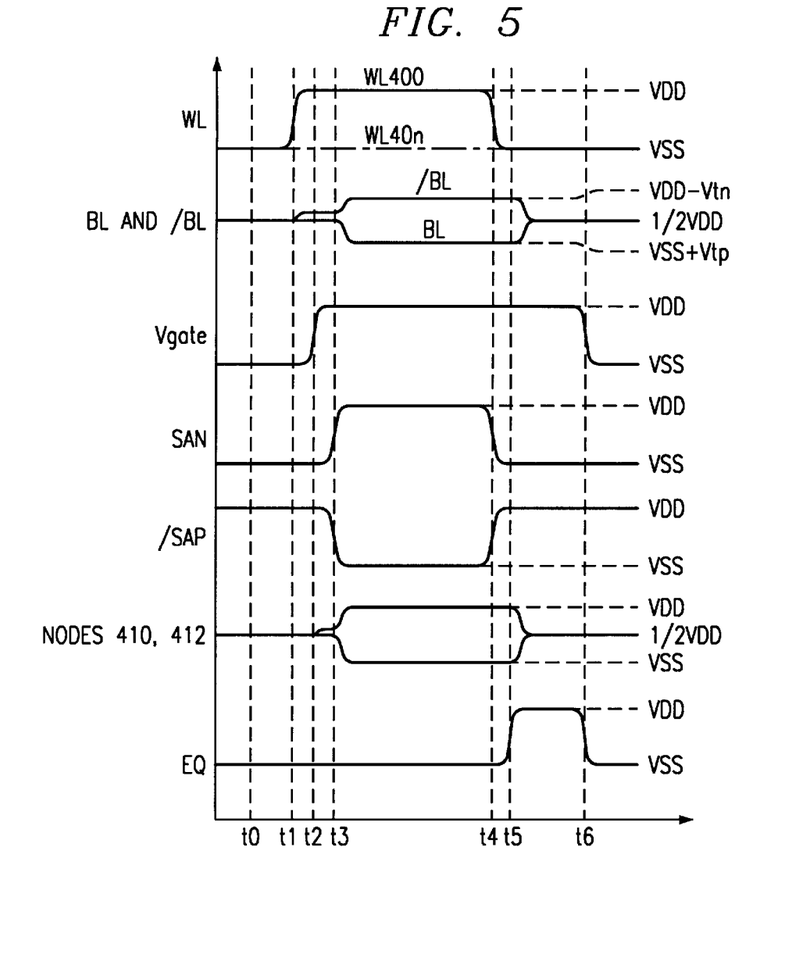
FIG. 5 is a timing diagram illustrating the operation of the DRAM architecture set forth in FIG. 4.

The operation of the preferred embodiment 400 is best understood with reference to FIG. 4 in conjunction with FIG. 5. FIG. 5 is a timing diagram illustrating the voltage levels of the signals and selected elements of the preferred embodiment 400 during a read operation. The read operation is initiated at time t1, and results in memory cell M400 being coupled to bit line /BL. It is assumed that memory cell M400 is storing a logic "1" (i.e., the storage node 402 is charged to VDD−Vtn).

At time t0, the preferred embodiment 400 is in a stand-by state. Both the word lines (WL400 and WL40n) are at VSS. Pass transistors N40nand N400 are turned off, and the storage capacitors C400 and C40n are isolated from the bit lines (BL and /BL). The bit lines have been equalized (by an equalization operation prior to time to) to a precharge voltage ½VDD. Because a memory cell will only be coupled to one bit line of the bit line pair (BL or /BL) in a given read operation, the equalization operation ensures that one bit line will provide a reference signal (the precharge voltage) while the other bit line will provide a data signal (the charge stored on a storage capacitor). Also at time t0, the Vgate signal is low, and all of the transistors in the clamping transfer gate circuit 414 are turned off, isolating the bit lines (BL and /BL) from the sense nodes (410 and 412). The SAN signal and /SAP signal are low and high, respectively, turning off pull-up and pull-down transistors P405 and N408, and disabling the sense amplifier circuit 418. The data nodes (410 and 412), like the bit lines (BL and /BL), have been previously equalized to the precharge voltage ½. The equalization circuit 416 is disabled by the EQ signal being low, which turns off transistors N403–N405.

At time t1, the read operation begins with the word line WL400 transitioning from VSS to VDD. Word line WL40n remains at VSS. It is noted that because the storage nodes (402 and 406) of the storage capacitors have a maximum potential of VDD−Vtn, the word lines (WL400 and WL40n) will not introduce a threshold voltage drop between the storage capacitors (C400 and C40n) and bit lines (BL and /BL). As a result, in the preferred embodiment, the word lines (WL400 and WL40n) are not booted. This eliminates the necessity of including circuits for generating the higher-than-supply booting voltage, and the circuits needed for generating the corresponding timing signals for such a booting operation. Thus, a reduction in size and complexity of the DRAM can result.

As word line WL400 transitions high, pass transistor N400 is turned on, coupling storage capacitor C400 to bit line /BL. With the storage node 402 at the voltage VDD−Vtn, bit line /BL will begin to rise in potential. Because bit line BL is coupled to only odd word lines, the bit line BL, which was previously precharged to the ½VDD potential, remains at the precharge voltage, serving as a reference signal for the data on bit line /BL.

At time t2, the Vgate signal goes from VSS to VDD, and the clamping transfer gate circuit 414 is activated, coupling the bit line pair (BL and /BL) to the sense nodes (410 and 412). With the Vgate signal at VDD, transistors N401 and N402 are turned on. In addition, inverter I400 turns on transistors P401 and P402. The SAN and /SAP signals remain low and high, respectively, and the sense amplifier circuit 418 is inactive. With the clamping transfer gate circuit 414 activated, the differential signal created by the data signal on bit line /BL, and the reference signal on bit line BL, results in a differential signal at the sense nodes (410 and 412). The EQ signal remains low, and hence the equalization circuit 416 is inactive.

At time t3, after the Vgate signal goes high and the bit lines (BL and /BL) are coupled to the sense nodes (410 and 412), the SAN signal goes high and the /SAP signal goes low, activating the sense amplifier circuit 418. In response to the differential signal present at the sense nodes (410 and 412) the sense amplifier circuit 418 drives the sense nodes (410 and 412) to opposite power supply levels (VDD and VSS). In the case of FIG. 5, because sense node 412 is higher in potential than sense node 410, sense node 412 will be driven to VDD and sense node 410 will be driven to VSS. As the sense nodes (410 and 412) are driven high and low, because the Vgate signal is still high, the change in voltages are coupled to the bit lines (BL and /BL).

With full supply voltages (VDD and VSS) at the sense nodes (410 and 412), the clamping transfer gate circuit 414 serves to limit (clamp) the magnitude of the voltages on the bit lines (BL and /BL). Because the gates of transistors N401 and N402 are driven at the voltage VDD, the highest voltage that can be coupled to the bit lines is VDD−Vtn. Similarly, because the gates of transistors P401 and P402 are driven at the voltage VSS, the lowest voltage that can be coupled to the bit lines is VSS+Vtp. In this manner the novel clamping transfer gate circuit 414 limits the array voltage, and hence power consumption.

Thus, the preferred embodiment clamping transfer gate circuit 414 can be conceptualized as including first clamping devices for limiting the high voltage on the bit lines (the n-channel devices N401 and N402, in the preferred embodiment), and second clamping devices for limiting the low voltage on the bit lines (the p-channel devices P401 and P402, in the preferred embodiment). It is the combination of the first and second clamping devices, coupled to each of the bit lines, which provides the bipolar reduction in the array operating voltage.

Between times t3 and t4 the memory cell M400 is refreshed by the bit /BL being driven to VDD−Vtn for a period of time while word line WL400 is high. It is understood that in this same time period, the potential at the sense nodes (410 and 412) can be coupled to decoder circuits, amplified, and eventually provided as an output signal.

At time t4, with the memory cell M400 refreshed, the word line WL400 drops to the VSS voltage level. Pass transistor N400 is turned off, isolating storage capacitor C400 from the bit line BL. The sense amplifier enable signals (SAN and /SAP) return to the low and high levels, respectively, disabling the sense amplifier circuit 418.

At time t5, the bit line equalization operation is initiated by the EQ signal going high. As the signal EQ goes high, transistor N403 is turned on, shorting the sense nodes 410 and 412 together. Concurrently, transistors N404 and N405 are turned on, precharging the bit line pair (BL and /BL) to the precharge voltage VBLR. As shown by the node 410/412 waveforms of FIG. 5, in the preferred embodiment, the VBLR voltage is ½VDD. It is noted that, while the sense nodes (410 and 412) are equalized and precharged, the Vgate signal remains at VDD. Thus, the precharge and equalization operation also precharges and equalizes the bit lines (BL and /BL). Notably, the bit line pair (BL and /BL) and the sense nodes (410 and 412) generally equalize to an equivalent voltage ½VDD, which can essentially eliminate the generation of a common mode signal being applied to the sense amplifier circuit 418. In this manner, the preferred embodiment addresses the common mode signal concerns of the prior art low voltage array, previously described.

At time t6, the bit line equalization operation terminates with the EQ signal and Vgate signal returning to VSS. The transistors within the equalization circuit 416 and the clamping transfer gate circuit 414 are turned off.

The preferred embodiment 400 includes an equalization circuit 418 disposed between the sense nodes (410 and 412). It is noted that an equalization circuit could be disposed between the bit lines (BL and /BL) themselves. Further, the equalization circuit need not be in the proximity of the sense amplifier circuit 418. For example, the clamping transfer gate structure 414 could be disposed at one end of the bit lines while the equivalent circuit could be disposed at the opposing end of the bit lines.

It is further noted that while the preferred embodiment illustrates a "folded" bit line arrangement, other embodiments could include "open" bit line architectures.

Figure 6:
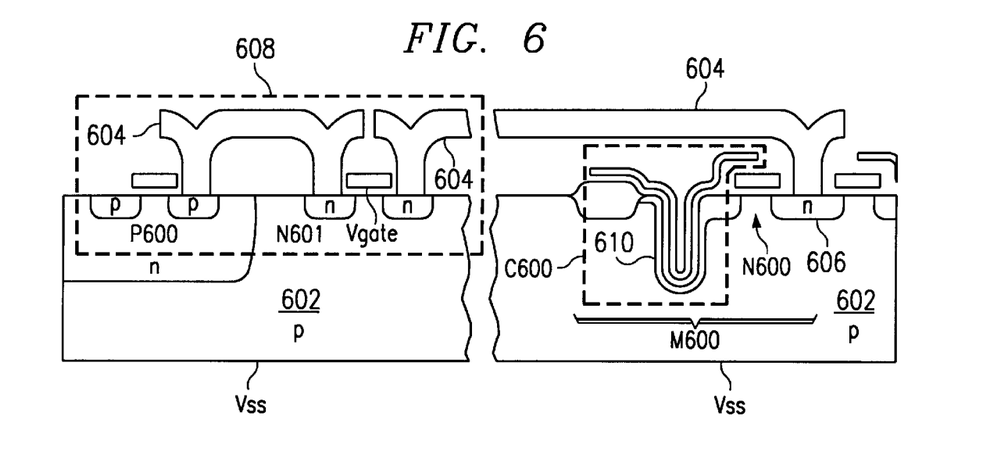
FIG. 6 is a side cross sectional view of a DRAM according to the preferred embodiment.

Referring now to FIG. 6, a side cross sectional view of DRAM is set forth to illustrate certain aspects of the preferred embodiment. The DRAM is designated by the general reference character 600 and is shown formed in a p-type semiconductor substrate 602. A memory cell M600, such as M400 shown in FIG. 4, is formed in the substrate 602, and includes a "trench" type storage capacitor C600 and an n-channel MOS pass transistor N600. A bit line 604 is coupled to the memory cell at a common n-type drain diffusion 606. The bit line 604 is shown also coupled to a clamping transfer gate circuit 608, that includes the series arrangement of an n-channel MOS transistor N601 and p-channel MOS transistor P600. Transistors N601 and P600 can be considered as corresponding to transistors N401 and P401 in FIG. 4. Accordingly, the gate of transistor N601 is shown receiving a Vgate signal.

It is recalled that in the preferred embodiment, as in the case of the word lines, the Vgate signal is not booted. Because the maximum voltage on the bit line 604 will be VDD−Vtn, no threshold drop in voltage will occur when the voltage on the bit line 604 is coupled to transistor P600. Consequently, the preferred embodiment 600 may dispense with the circuits necessary to implement a booted transfer gate signal, such as the TG signal of the prior art, shown in FIG. 2. This advantageously reduces the complexity, and to a limited extent, the size of the DRAM.

It is also noted that during the operation of the preferred embodiment, the minimum voltage seen by both the sources and the drains of the pass transistors, such as transistor N600, is the voltage level VSS+Vtp. This voltage is greater than the voltage of the word lines in the stand-by state, which are at VSS. Therefore, in the stand-by state, the gates of pass transistor N600 will be at VSS, providing a low leakage condition in the pass transistors. Consequently, the preferred embodiment does not utilize threshold adjustment steps to create pass transistors with higher threshold voltages. This can result in a reduction in the complexity of the fabrication process. For example, no additional masks are needed to isolate pass transistors from the other n-channel transistors in the DRAM. Further, the additional ion implantation step required for array threshold adjustment can be eliminated.

Referring once again to FIG. 6, it is shown that the substrate 602 is biased at the low power supply voltage, VSS. This is in contrast to the prior art arrangement of FIG. 3, which uses a negative back-bias voltage. Because the lowest potential at the storage node 610 of the storage capacitor C600 will be VSS+Vtp, the substrate 602 would have to rise (in a substrate bounce condition) well above the VSS potential to forward bias the storage node 610. Accordingly, the preferred embodiment does not require the additional circuitry required for a substrate pump (the circuit that generates a negative back-bias voltage in the substrate).

The preferred embodiment provides advantageous bias conditions across common drain diffusions as well. As set forth in FIG. 6, with the substrate 600 at the VSS potential, and the bit line 604 reaching a voltage no lower than VSS+Vtp, the common drain diffusion 606 will be maintained at a reverse bias condition. This reduces the capacitance of common drain diffusion 606, more so than if the substrate 602 was maintained at low array potential.

Thus, the bipolar reduction in array voltage can result in a DRAM that does not require booted transfer gate signals, substrate back-biasing circuits, or high threshold pass transistors, and yet still includes many of the benefits of these conventional DRAM circuits. This is all above and beyond the considerable savings in power consumption and non-booted word line approach already described.

Figure 7A:
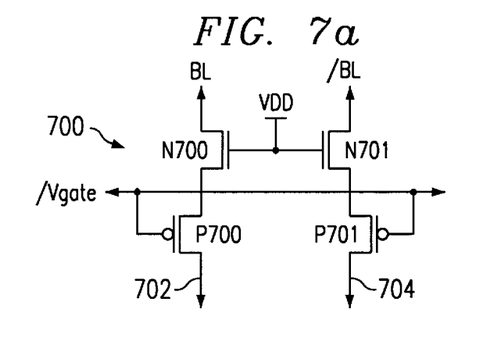
FIGS. 7a and 7b illustrate two variations on clamping transfer gate circuits according to the preferred embodiment.
Figure 7B:
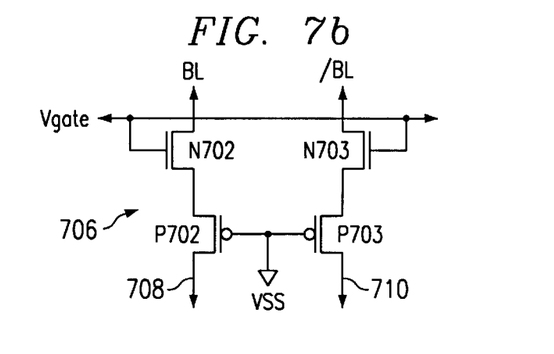

Referring now to FIGS. 7a and 7b, schematic diagrams of two alternate clamping transfer gate circuits are illustrated. These circuits may be substituted for the clamping transfer gate circuit 414 set forth in FIG. 4. Both clamping transfer gates circuits have two pairs of transistors having opposite conductivity types. One pair of transistors has their gates tied to a power supply voltage to maintain that pair of transistors in an on condition.

In FIG. 7a, the clamping transfer gate circuit is designated by the general reference character 700, and includes a pair of n-channel MOS transistors, N700 and N701, and a pair of p-channel transistors P700 and P701. Transistors N700 and P700 have source-drain paths arranged in series, and transistors N701 and P701 have source-drain paths arranged in series. The gates of transistors P700 and P701 receive a /Vgate signal. The /Vgate signal is the inverse of the Vgate signal illustrated in FIG. 5, and drops from VDD to VSS when the clamping transfer gate circuit 700 is activated. Unlike the clamping transfer gate circuit 414 of FIG. 4, the gates of transistors N700 and N701 do not receive the Vgate signal, but instead are tied to the high power supply voltage VDD. The source-drain paths of transistors N700 and N701 are coupled to bit lines BL and /BL, respectively. The source-drain paths of transistors P700 and P701 are coupled to sense node 702 and 704. The series connected p- and n-channel transistors perform a clamping function on the bit lines (BL and /BL). In the event one of the sense nodes (702 or 704) is driven to VDD by a sense amplifier, the n-channel transistor (N700 or N701) in the path between a bit line (BL or /BL) and its associated sense node (702 or 704) will limit the voltage to VDD−Vtn. Similarly, if a sense node (702 and 704) is driven to VSS, the p-channel transistor (P700 or P701) in the path between a bit line (BL and /BL) and its associated sense node (702 and 704) will be limited to the voltage VSS+Vtp.

The clamping transfer gate circuit of FIG. 7b is shown as 706, and has the same general transistor arrangement as the circuit 700 in FIG. 7a. A pair of n-channel transistors N702 and N703 is arranged in series with a pair of p-channel transistors P702 and P703. The circuit 706 of FIG. 7b differs from the circuit 700 of FIG. 7a in that the gates of the p-channel transistors P702 and P703 are tied to the low power supply voltage, VSS. The gates of the n-channel transistors N702 and N703 are driven by the Vgate signal. The Vgate signal was previously described in conjunction with FIG. 5. Transistors N702 and P702 clamp the voltage on a bit line BL between VDD−Vtn and VSS+Vtp. Transistors N703 and P703 perform the same clamping function to bit line /BL.

It is noted that the clamping transfer gate circuits disclosed (414, 700 and 706) have n-channel transistors (N401/N402, N700/N701 and N702/N703) coupled to bit lines (BL and /BL) and p-channel transistors (P401/P402, P700/P701 and P702/P703) coupled to sense nodes (410/412, 702/704 and 708/710). Because the pass transistors within the array are also n-channel transistors, the n-channel transistors of the clamping transfer gate circuits can be advantageously situated adjacent to the array. However, it is understood that the position of the p-channel transistors and n-channel transistors within the clamping transfer gates can be switched.

While the passing transfer gate circuits (700 and 702) set forth in FIGS. 7a and 7b set forth configurations in which the transfer gate is enabled by a Vgate or /Vgate signal that varies between supply voltage levels, it is understood that the Vgate (or /Vgate) signal could be varied to clamp the voltages to a different level.

Having described the circuits of the preferred embodiment, storage capacitor structures for use in DRAM memory cells will now be discussed.

The reduction in array voltage can reduce the quantity of charge stored in each memory cell. To compensate for this, the size of the memory cells can be increased. For example, the sense voltage Vsense (the amount a bit line varies from the reference voltage) can be calculated by the following equation;

$$Vsense = \left( \frac{\frac{\varepsilon A_1}{d_1}}{Cbl + \frac{\varepsilon A_1}{d_1}} \right) V_1$$

where the charge provided by the storage capacitor is given by $\varepsilon(A1)$, $\varepsilon$ being the dielectric strength of the dielectric used in the storage capacitor, and A1 being the area of the storage node of the storage capacitor, where Cbl is the capacitance of the bit line, with V1 being the voltage written into the cell.

In the event the voltage written to the cell (the array voltage) is reduced from V1 to a lesser magnitude V2, but the same bit line capacitance and dielectric strength are maintained, the size of the storage capacitor area A2 required to maintain the same sense voltage is given by the following equation;

$$A2 = \frac{A1}{1 - \frac{C1}{Cbl}\left(\frac{V1}{V2} - 1\right)}$$

where C1 is the capacitance of the storage capacitor.

Thus, it is shown that if a bit line capacitance (Cbl) to storage capacitor capacitance (C1) ratio of 6:1 is assumed, for a reduction in array voltage of one half (V2=½(V1)) a 75% reduction in power can be achieved, with only a 20% increase in storage capacitor size.

As an alternative to increasing storage capacitor size, the storage capacitor structure may be altered to increase the amount of charge stored by the memory cell. To illustrate storage capacitor structures, a side cross sectional view of a trench type storage capacitor 800 is set forth in FIG. 8a, and a side cross sectional view of a "stacked" type storage capacitor 802 is set forth in FIG. 8b. The trench type capacitor 800 includes a storage node 804, a storage dielectric 806, and a counter node 808. The stacked type capacitor 802 includes the same general elements; storage node 810, storage dielectric 812, and counter node 814.

Figure 8A:
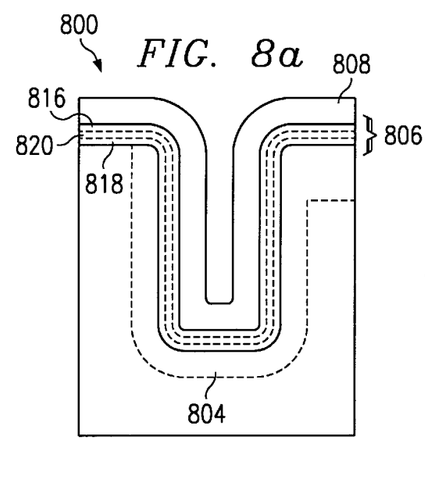
FIGS. 8a and 8b are a side cross sectional view of DRAM cell capacitors that may be used in the preferred embodiment.
Figure 8B:
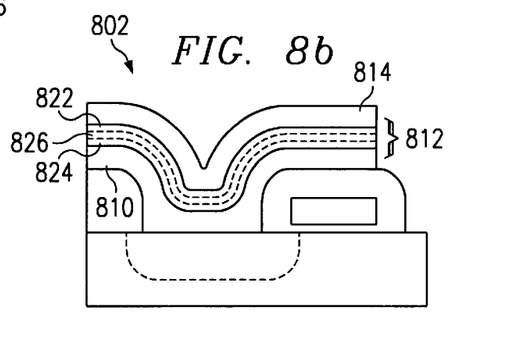

The amount of charge stored by a storage capacitor (such as 800 and 802) can be increased by using dielectric materials having a higher dielectric constant. Just one of the alternative dielectric materials that could be employed, is one that includes barium strontium titanate $(Ba_{1-x}Sr_x)TiO_3$. Thus, if storage capacitors are formed with this high dielectric constant material, the array voltage could be reduced without having to increase the size of the storage capacitors.

Figure 9:
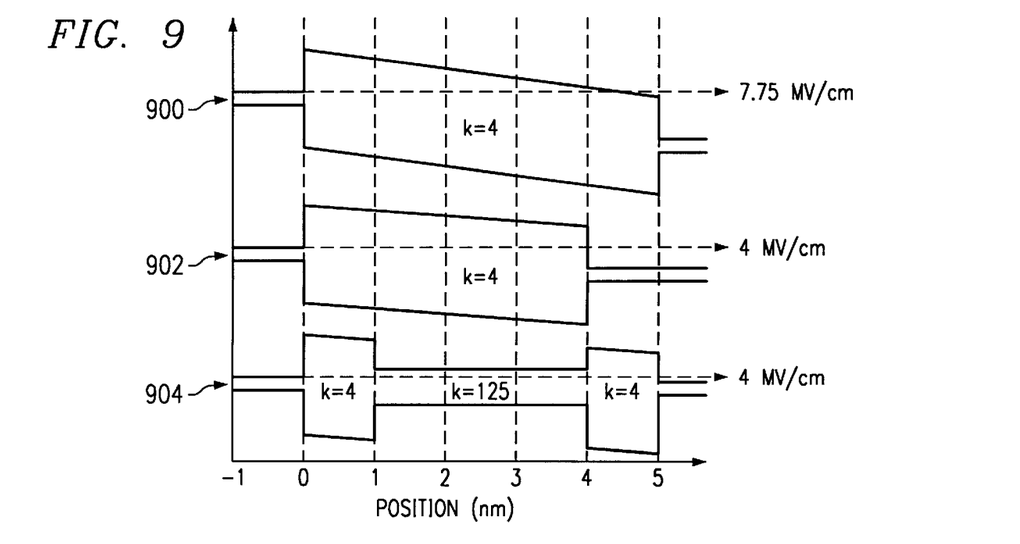
FIG. 9 is a diagram setting forth band diagrams of semiconductor-dielectric-semiconductor systems, to illustrate the tunneling and leakage characteristics of modified storage capacitors.

In addition to high dielectric constant materials, the capacitance of the storage capacitor can be increased by reducing the thickness of the dielectric material. However, the reduction of dielectric materials is subject to some practical constraints. Referring now to FIG. 9 band diagrams are set forth illustrating capacitor structures to illustrate various aspects of concern when reducing dielectric thickness in storage capacitors.

The band diagram 900 illustrates the constraint introduced by Fowler-Nordheim tunneling. For conventional dielectric materials, such as a "stack" of silicon dioxide-silicon nitride-silicon dioxide ("ONO"), the field across the dielectric is usually in the range of 4 MV/cm. At relatively higher field strengths, those approaching 7 MV/cm, the tunneling current will be appreciable at layers less than 4.5 nm. This is illustrated by the dashed arrow which illustrates the path of a tunneling electron. Accordingly, high fields across the storage capacitor dielectric can lead to leakage amounts that can impact the reliability of the DRAM cell.

At the same time, conventional field strengths of about 4 MV/cm may not be suitable for thinner dielectrics due to direct tunneling. Direct tunneling is shown in the band diagram 902. The dashed arrow represents the path of a tunneling electron. For dielectric thickness less than 4 nm, the probability of direct tunneling occurring is higher than for thicker dielectrics, and can adversely effect the ability of a storage capacitor to maintain charge.

The band diagram 904 illustrates a scheme to allow for a conventional field strength, while at the same time reducing the adverse effect of direct tunneling. In the band diagram 904, a dielectric having a typical dielectric constant of 4, sandwiches a relatively thick dielectric having a very high dielectric constant of 125. While the high dielectric constant material adds to the overall thickness of the dielectric, there is very little voltage drop across it. One particular material that may be used as the high dielectric constant is titanium oxide ($TiO_2$). Titanium oxide is preferred as it is a material that is already used in many semiconductor manufacturing processes, typically as a barrier layer for metallization, and as a silicide for reducing resistivity of polysilicon conductors, or metal-to-silicon contacts. Thus the "effective" thickness of the storage capacitor dielectric (i.e., the thickness taking into account the dielectric constant of the material) can be reduced, to increase the amount of charge stored, without the adverse effects of a substantial direct tunneling current.

Referring once again to FIGS. 8a and 8b, the capacitor dielectric layers are shown divided into three layers. In the case of the trench capacitor 800 of FIG. 8a, the capacitor dielectric has a first outside layer 816, a second outside layer 818, and a middle (a sandwiched) layer 820. In the case of stacked capacitor 802, the dielectric includes first and second outside layers, 822 and 824, and middle layer 826. A DRAM according to one embodiment, could utilize the bipolar reduced array voltage, as described above, in combination with a storage capacitor in which the outside layers (816/818 and 822/824) of the capacitor dielectric are of lower dielectric constant material, such as silicon nitride, while the middle layers (820 and 826) are formed from a high dielectric constant material, such as titanium oxide. Such an embodiment could provide the sufficient charge to the bit lines without a substantial increase in the size of the capacitor, or the adverse effects associated with very thin dielectrics, such as direct tunneling. It is understood that while the thickness of the various capacitor dielectrics illustrated in FIGS. 8a and 8b appear generally equal, the middle layer may be substantially thicker than the outer layers, such as the case illustrated by band diagram 904 in FIG. 9.

While the preferred embodiment has been described in terms of a DRAM architecture, the low voltage teachings could be incorporated into other memory device types, such as SRAMs or electrically programmable read-only-memories (EPROMs). In addition, other devices employing equalization operations for rapid cycling through logic and/ or memory functions can benefit from the bipolar power supply reduction teachings of the preferred embodiment.

Accordingly, although the present invention has been described in detail, it should be understood that various changes, substitutions, and alterations could be made without departing from the spirit and scope of the invention as defined by the appended claims.

What is claimed is:

1. A semiconductor memory device, comprising:
    an array of dynamic random access memory cells, each memory cell in the array of memory cells including a storage capacitor having a dielectric that includes a first outer layer, a second outer layer, and an inner layer intermediate the first outer layer and the second outer layer;
    a plurality of bit lines coupled to the array of memory cells;
    a plurality of sense amplifiers, each sense amplifier receiving a data signal on at least one sense node, and driving the at least one sense node to a first supply voltage or a second supply voltage according to the data signal; and
    a plurality of clamping gate circuits, each clamping gate circuit coupling an associated sense node to an associated bit line, and
        clamping its associated bit line to a voltage less than the first supply voltage when a sense amplifier drives its associated sense node to the first supply voltage, and
        clamping its associated bit line to a voltage greater than the second supply voltage when the sense amplifier drives its associated sense node to the second supply voltage.

2. The semiconductor memory device of claim 1, wherein:
    the plurality of bit lines are arranged into bit line pairs; and
    each sense amplifier receives a data signal on a first sense node and a reference signal on a second sense node, and drives the first node to one of the power supply voltages and the second node to the other power supply voltage according to the data signal.

3. The semiconductor memory device of claim 1, wherein:
    the array of memory cells includes a plurality of dynamic random access memory cells.

4. The semiconductor memory device of claim 3, wherein:
    each memory cell in the array of memory cells includes a storage capacitor having a dielectric that includes barium strontium titanate.

5. The semiconductor memory device of claim 3, wherein:
    the inner layer includes titanium oxide.

6. The semiconductor memory device of claim 1, wherein:
    each clamping gate circuit includes a transistor of a first conductivity type coupled in series with a transistor of a second conductivity type.

7. The semiconductor memory device of claim 6, wherein:
    each clamping gate circuit further includes an inverter coupled between the gates of the first transistor and the second transistor.

8. The semiconductor memory device of claim 6, wherein:
    the transistor of the first conductivity type has a gate coupled to the second power supply voltage.

9. The semiconductor memory device of claim 6, wherein:
    the transistor of the second conductivity type has a gate coupled to the first power supply voltage.

10. The semiconductor memory device of claim 6, wherein:

the transistors are insulated gate field effect transistors (IGFETs), and the first conductivity type is p-type and the second conductivity type is n-type.

11. The semiconductor memory device of claim 10, wherein:

each clamping gate circuit
clamps its associated bit line to a voltage less than the first supply voltage by a threshold voltage of the n-type transistor when a sense amplifier drives its associated sense node to the first supply voltage, and
clamping its associated bit line to a voltage greater than the second supply voltage by a threshold voltage of the p-type transistor when the sense amplifier drives its associated sense node to the second supply voltage.

12. In a semiconductor memory device receiving a first power supply voltage and a second power supply voltage, a reduced array voltage architecture, comprising:

a plurality of bit lines coupled to memory cells having pass transistors of a first conductivity type;

a first power supply voltage node that receives the first power supply voltage; and a bipolar clamping circuit coupled to each bit line, each bipolar clamping circuit having
a first clamping transistor of the first conductivity type for limiting the voltage of its respective bit line to a potential that differs from the first power supply voltage by a first predetermined voltage, the first clamping transistor having a source/drain node coupled to the bit line, and
a second clamping transistor of a second conductivity type for limiting the voltage of its respective bit line to a potential that differs from the second power supply voltage by a second predetermined voltage; wherein
the first clamping transistor is formed between the second clamping transistor and the memory cells.

13. The semiconductor memory device of claim 12, wherein:

the first power supply voltage is a high power supply voltage.

14. The semiconductor memory device of claim 12, wherein:

the first power supply voltage is a low power supply voltage.

15. The semiconductor memory device of claim 12, further including:

the plurality of bit lines includes bit line pairs; and
an equalization circuit is disposed between the bit line pairs, the equalization circuit shorting the bit line pairs together when activated.

16. The semiconductor memory device of claim 12, further including:

the plurality of bit lines includes bit line pairs;
the bipolar clamping circuits couple bit line pairs to sense node pairs; and
an equalization circuit is disposed between the sense node pairs, the equalization circuit shorting the sense node pairs together when activated.

17. The semiconductor memory device of claim 16, wherein:

each equalization circuit includes an IGFET having a source-drain path coupled between bit line pairs.

18. The semiconductor memory device of claim 12, wherein:

the first and second clamping transistors include insulated gate field effect transistors (IGFETs).

19. The semiconductor memory device of claim 18, wherein:

the transistors of the first conductivity type include n-channel IGFETs, the transistors of the second conductivity type include p-channel IGFETs.

20. The semiconductor memory device of claim 19, wherein:

the first predetermined voltage is the threshold voltage of an n-channel IGFET, and the second predetermined voltage is the threshold voltage of a p-channel IGFET.

21. The semiconductor memory device of claim 12, wherein:

each bipolar clamping circuit includes the transistor of the first conductivity type being in series with the transistor of the second conductivity type.

22. The semiconductor memory device of claim 21, further including:

a plurality of memory cells coupled to at least one bit line, each memory cell including a pass transistor for coupling a storage device to the bit line, the pass transistor being of the first conductivity type; and
a bit line is coupled to the transistor of the first conductivity type in each bipolar clamping device.

23. The semiconductor memory device of claim 22, wherein:

the transistors of the first conductivity type include n-channel IGFETs.

24. An integrated circuit memory device having a reduced array voltage, comprising:

a plurality of memory cells;
a plurality of bit lines coupled to the memory cells;
a sense node associated with each of the bit lines;
a sense amplifier coupled between the sense nodes, the sense amplifier providing a low impedance path between a low power supply voltage and its respective sense node in response to a potential on its sense node being less than a reference potential; and
a voltage clamping circuit that includes at least one clamping transistor having a gate coupled to a power supply voltage node, the voltage clamping circuit being coupled between each sense node and a bit line and introducing a high impedance path between its respective bit line and sense node in response to the sense node being lower than a predetermined low clamp voltage, the low clamp voltage being greater than the low power supply voltage.

25. The semiconductor memory device of claim 24, wherein:

each voltage clamping circuit includes a p-channel insulated gate field effect transistor (IGFET) having a source-drain path disposed between its respective bit line and sense node.

26. The semiconductor memory device of claim 25, wherein:

the gate of the p-channel IGFET within each voltage clamping circuit is coupled to a potential equivalent of the low power supply voltage.

27. The semiconductor memory device of claim 25, wherein:

the low clamping voltage is greater than the low supply voltage by an amount equivalent to the threshold voltage of the p-channel IGFET in each voltage clamping circuit.

28. The semiconductor memory device of claim 25, wherein:
   each sense amplifier further provides a low impedance path between a high power supply voltage and its respective sense node in response to a potential on its sense node being greater than the reference potential; and
   each voltage clamping device further introduces a high impedance path between its respective bit line and sense node in response to the sense node being greater than a predetermined high clamp voltage, the high clamp voltage being less than the high power supply voltage.

29. The semiconductor memory device of claim 28, wherein:
   each sense amplifier is coupled to a pair of sense nodes, one of the sense nodes providing the reference potential.

30. The semiconductor memory device of claim 28, further including:
   an equalization circuit for placing the bit lines and sense nodes at an equalization voltage, the equalization voltage being intermediate the low clamp voltage and the high clamp voltage.

31. The semiconductor memory device of claim 30, wherein:
   the equalization voltage is generally equivalent to the reference potential.

32. The semiconductor memory device of claim 28, wherein:
   each voltage clamping circuit includes a p-channel IGFET in series with an n-channel IGFET, the source-drain paths of the p-channel and n-channel IGFETs being disposed between one of the bit lines and one of the sense nodes.

33. The semiconductor memory device of claim 32, wherein:
   the gate of the n-channel IGFET within each voltage clamping circuit is coupled to a potential equivalent of the high power supply voltage.

34. The semiconductor memory device of claim 32, wherein:
   the voltage clamping circuit further includes an inverter disposed between the gates of the n- and p-channel transistors.

* * * * *